United States Patent
Dong et al.

(10) Patent No.: US 12,426,345 B2
(45) Date of Patent: Sep. 23, 2025

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Zhiwen Dong, Suzhou (CN); Qiyue Zhao, Suzhou (CN); Maolin Li, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 145 days.

(21) Appl. No.: 17/426,656

(22) PCT Filed: Jun. 15, 2021

(86) PCT No.: PCT/CN2021/100070
§ 371 (c)(1),
(2) Date: Jul. 29, 2021

(87) PCT Pub. No.: WO2022/261819
PCT Pub. Date: Dec. 22, 2022

(65) Prior Publication Data
US 2025/0048713 A1 Feb. 6, 2025

(51) Int. Cl.
*H10D 84/01* (2025.01)
*H10D 8/00* (2025.01)
(Continued)

(52) U.S. Cl.
CPC ............ *H10D 84/01* (2025.01); *H10D 8/043* (2025.01); *H10D 8/422* (2025.01);
(Continued)

(58) Field of Classification Search
CPC ........ H10D 84/01; H10D 8/043; H10D 8/422; H10D 30/051; H10D 30/831; H10D 62/8503; H10D 84/05; H10D 84/811
See application file for complete search history.

(56) References Cited

U.S. PATENT DOCUMENTS

| 7,982,239 B2 * | 7/2011 | McNutt | H10D 84/038 |
| | | | 257/471 |
| 2007/0120201 A1 * | 5/2007 | Yamaguchi | H10D 30/668 |
| | | | 257/E29.066 |

(Continued)

FOREIGN PATENT DOCUMENTS

| CN | 105103295 A | 11/2015 |
| CN | 112420694 A | 2/2021 |

OTHER PUBLICATIONS

International Search Report and Written Opinion of the corresponding PCT application No. PCT/CN2021/100070 mailed on Feb. 24, 2022.

*Primary Examiner* — Jay C Kim
*Assistant Examiner* — Woo K Lee
(74) *Attorney, Agent, or Firm* — Li & Cai Intellectual Property (USA) Office (57) ABSTRACT

A nitride-based semiconductor device includes a first nitride-based semiconductor layer, a second nitride-based semiconductor layer, a gate electrode, a first source electrode, a second source electrode, and a drain electrode. The second nitride-based semiconductor layer includes a drift region doped, a first barrier region, and a second barrier region. The first and second barrier regions extend downward from a top surface of the second nitride-based semiconductor layer and are separated from each other by a portion of the drift region. The gate electrode is disposed on the first barrier region. The first source electrode is disposed on the portion of the drift region. The second source
(Continued)

electrode is disposed on the second barrier region and is electrically coupled with the first source electrode. The drain electrode is connected to the first nitride-based semiconductor layer.

13 Claims, 8 Drawing Sheets (51) Int. Cl.
*H10D 8/01* (2025.01)
*H10D 30/01* (2025.01)
*H10D 30/83* (2025.01)
*H10D 62/85* (2025.01)
*H10D 84/05* (2025.01)
*H10D 84/80* (2025.01)

(52) U.S. Cl.
CPC ......... *H10D 30/051* (2025.01); *H10D 30/831* (2025.01); *H10D 62/8503* (2025.01); *H10D 84/05* (2025.01); *H10D 84/811* (2025.01)

(56) References Cited

U.S. PATENT DOCUMENTS

| | | | |
|---|---|---|---|
| 2007/0252178 A1 | 11/2007 | Onose | |
| 2014/0191241 A1* | 7/2014 | Edwards | H10D 84/87 257/265 |
| 2014/0231883 A1* | 8/2014 | Esteve | H10D 62/343 438/192 |
| 2018/0122931 A1 | 5/2018 | Siemieniec et al. | |

* cited by examiner

NITRIDE-BASED SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device for a vertical junction gate field-effect transistor integrated with a diode.

BACKGROUND OF THE DISCLOSURE

In recent years, intense research on power semiconductor devices has been prevalent for rapid development in different technical fields, such as hybrid and electric vehicles, solar cells, military and aerospace. Examples of power semiconductor devices can include IGBT (insulated gates bipolar transistor), IGCT (integrated grid change transistor), MOSFET (metal oxides semiconductor field effect transistor), high-electron-mobility transistor (HEMT) and JFET (junction gate field-effect transistor).

In a JFET device, carriers can pass through a channel region and thus flow from a source electrode to a drain electrode. The channel width can be modulated by way of changing a voltage applied to a gate electrode, thereby allowing a predetermined current to pass therethrough. The electrical characteristics of JFETs satisfy the demands of high power/frequency devices.

SUMMARY OF THE DISCLOSURE

In accordance with one aspect of the present disclosure, a nitride-based semiconductor device is provided. A nitride-based semiconductor device includes a first nitride-based semiconductor layer, a second nitride-based semiconductor layer, a gate electrode, a first source electrode, a second source electrode, and a drain electrode. The first nitride-based semiconductor layer is doped to a first conductivity type. The second nitride-based semiconductor layer is disposed over the first nitride-based semiconductor layer and includes a drift region doped to a second conductivity type, a first barrier region doped to a third conductivity type, and a second barrier region doped to the third conductivity type. The first and second barrier regions extend downward from a top surface of the second nitride-based semiconductor layer and are separated from each other by a portion of the drift region. The gate electrode is disposed on the first barrier region. The first source electrode is disposed on the portion of the drift region. The second source electrode is disposed on the second barrier region and is electrically coupled with the first source electrode. The drain electrode is connected to the first nitride-based semiconductor layer.

In accordance with another aspect of the present disclosure, a method for manufacturing a semiconductor device is provided. The method includes steps as follows. A first nitride-based semiconductor layer is formed. A second nitride-based semiconductor layer having a drift region is formed on the first nitride-based semiconductor layer. A first second barrier region and a second barrier region are formed on the drift region, such that the first and second barrier regions are separated from each other by a portion of the second nitride-based semiconductor layer. A gate electrode is formed on the first barrier region. A first source electrode is formed on the portion of the second nitride-based semiconductor layer. A second source electrode is formed on the second barrier region. The first source electrode is electrically coupled with the second source electrode. A drain electrode is formed to connect to the first nitride-based semiconductor layer.

In accordance with one aspect of the present disclosure, a nitride-based semiconductor device is provided. The nitride-based semiconductor device includes a first nitride-based semiconductor layer, a second nitride-based semiconductor layer, a gate electrode, a first source electrode, a second source electrode, and a drain electrode. The first nitride-based semiconductor layer is doped to a first conductivity type. The second nitride-based semiconductor layer is disposed over the first nitride-based semiconductor layer and includes a drift region and a first barrier region and a second barrier region. The drift region is doped to a second conductivity type. The first barrier region and the second barrier region are doped to a third conductivity type. The first and second barrier regions extend inward from opposite sidewalls of the second nitride-based semiconductor layer to confine an inlet of the drift region. The gate electrode is disposed on the first barrier region and is electrically connected to a first electrical node. The first source electrode is disposed on the drift region and is electrically connected to a second electrical node different from the first electrical node. The second source electrode is disposed on the second barrier region and is electrically connected to the second electrical node. The drain electrode is connected to the first nitride-based semiconductor layer.

With such a configuration, a vertical junction gate field-effect transistor (JFET) and a diode can be integrated into the same semiconductor device, which means the operation of the semiconductor device can be switched between a JFET mode and a diode mode. Moreover, to comply with the different requirements for the JFET and diode modes, the barrier regions can vary features such as dopant concentrations, the widths or lengths of the various regions, or combinations thereof.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual devices, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

In the present disclosure, a doping region can have a conductive type expressed as a combination of a doping type and a plus/minus sign. For example, with respect to n-type dopant, there are three conductive types, including "n+", "n−", and "n". An $n^+$ doping region has a doping concentration higher/heavier than an n-doping region; and an n-doping region has a doping concentration than higher an n'-doping region. Doping regions of the same symbol may have different absolute doping concentrations. For example, two different $n^+$ doping regions may have the same or different absolute doping concentrations. The definition can be applied to the p-type doping. In some embodiments, the n-type dopant can include, but are not limited to, silicon (Si), carbon (C), germanium (Ge), Selenium (Se), tellurium (Te), or the like. In some embodiments, the p-type dopant can include, but are not limited to, magnesium (Mg), beryllium (Be), zinc (Zn), or the like. In the exemplary illustrations of the present disclosure, although the element is illustrated as a single layer, it can include multiple layers therein.

Figure 1A:
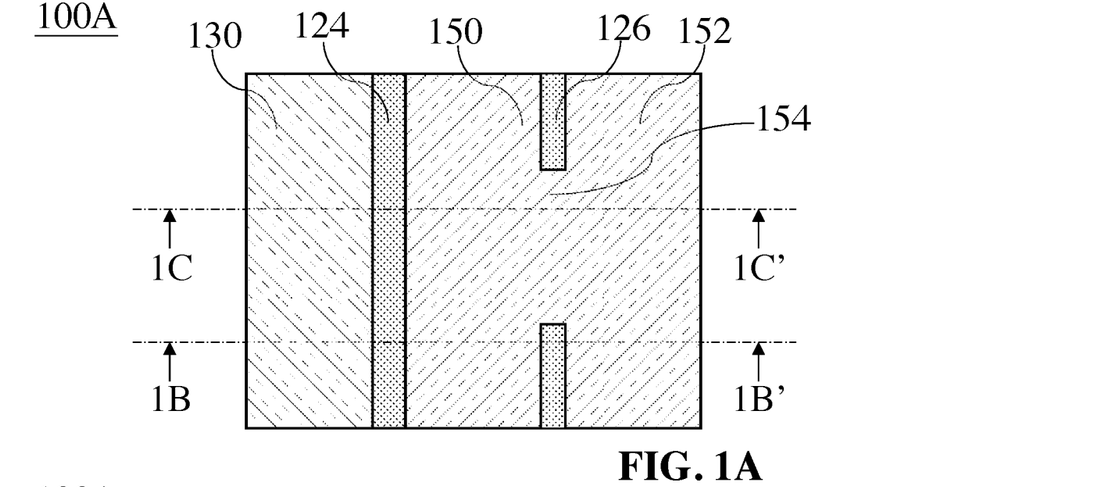
FIG. 1A is a top view of a nitride-based semiconductor device according to some embodiments of the present disclosure.
Figure 1B:
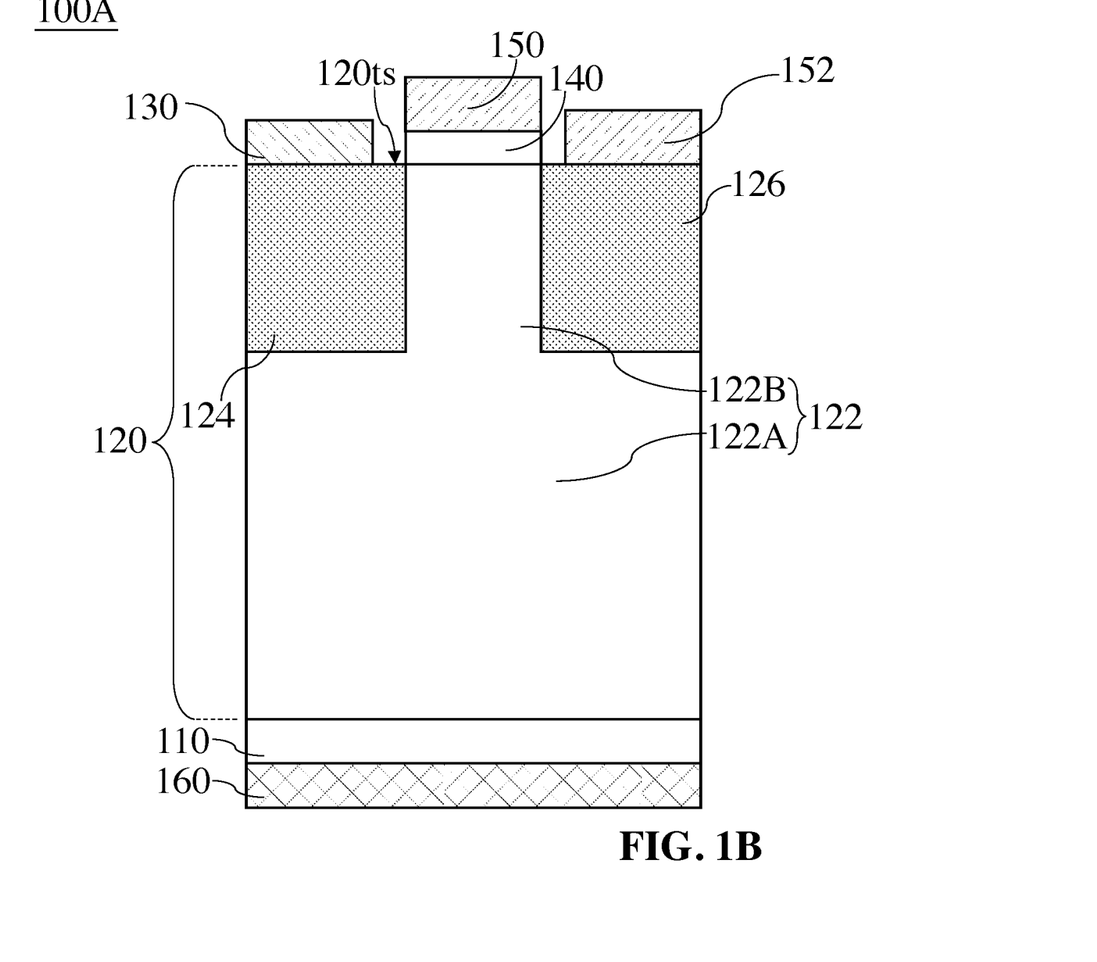
FIG. 1B is a vertical cross-sectional view across a line 1B-1B' of the semiconductor device in FIG. 1A.

FIG. 1A is a top view of a nitride-based semiconductor device 100A according to some embodiments of the present disclosure. FIG. 1B is a vertical cross-sectional view across a line 1B-1B' of the semiconductor device 100A in FIG. 1A. The semiconductor device 100A includes nitride-based semiconductor layers 110 and 120, a gate electrode 130, nitride-based semiconductor layer 140, source electrodes 150 and 152, and a drain electrode 160.

The nitride-based semiconductor layer 110 can be doped to have a first conductivity type. In some embodiments, the nitride-based semiconductor layer 110 is doped to have an n+ conductivity type. In some embodiments, the dopant concentration of the nitride-based semiconductor layer 110 is in a range from about $1 \times 10^{19}$ cm$^{-3}$ to about $1 \times 10^{21}$ cm$^{-3}$. The exemplary materials of the nitride-based semiconductor layer 110 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1.

The nitride-based semiconductor 120 is disposed on/over the nitride-based semiconductor 110. The nitride-based semiconductor 120 includes a drift region 122 and barrier regions 124 and 126.

The drift region 122 is connected to the barrier regions 124 and 126. The barrier regions 124 and 126 extend downward from a top surface 120ts of the nitride-based semiconductor layer 120. The barrier regions 124 and 126 are separated by a portion of the drift region 122. To be more specific, the drift region 122 includes a base portion 122A and an extended portion 122B extending upward from the middle of the base portion 122A. The barrier regions 124 and 126 are located on and in contact with the base portion 122A and are spaced apart by the extended portion 122B. The extended portion 122B is located between the barrier regions 124 and 126 forms interfaces with the barrier regions 124 and 126.

The extended portion 122B of the drift region 122 can serve as a cut-off region that can be modulated to control the flow of carriers between the barrier regions 124 and 126. To achieve the modulation, the drift region 122 and the barrier regions 124 and 126 may have opposite doping types. For example, the drift region 122 may be doped to have a second conductivity type, and the barrier regions 124 and 126 are doped to have a third conductivity type, in which the second and third are opposite conductivity types. As such, a depletion region can arise at a p-n junction formed between the drift region 122 and the barrier regions 124 and 126. In this regard, bias (e.g., a forward or reverse bias) applied to the p-n junction will make the depletion region laterally expand across the extended portion 122B. Accordingly, at an off-state, the depletion region can cause the flow of carriers to be disrupted in the extended portion 122B. Correspondingly, at an on-state, the drift region 122 can provide a path through which carriers flow with a vertical direction.

In some embodiments, the drift region 122 can be doped to have an n conductivity type such that the doping concentration of the nitride-based semiconductor layer 120 is lighter than that of the nitride-based semiconductor layer 110. In some embodiments, the n-type dopant of the drift region 122 is in a range from about $1 \times 10^{12}$ cm$^{-3}$ to about $1 \times 10^{16}$ cm$^{-3}$. In some embodiments, the barrier regions 124 and 126 can be doped to each have a p conductive type. In some embodiments, the concentration of the p-type dopant of the barrier region 124 or 126 is in a range from about $1 \times 10^{16}$ cm$^{-3}$ to about $1 \times 10^{18}$ cm$^{-3}$. In some embodiments, the barrier region 124 or 126 may have the concentrations referring to such range but being different than or the same as each other.

The exemplary materials of the nitride-based semiconductor layer 120 can include, for example but are not limited to, nitrides or group III-V compounds, such as GaN, AlN, InN, $In_xAl_yGa_{(1-x-y)}N$ where $x+y\leq 1$, $Al_yGa_{(1-y)}N$ where $y\leq 1$. In some embodiments, the nitride-based semiconductor layers 110 and 120 are made of the same material. For example, the nitride-based semiconductor layers 110 and 120 each include GaN. That is, the drift region 122 and the barrier regions 124 and 126 each include GaN.

The gate electrode 130 is disposed on the barrier region 124. The gate electrode 130 is electrically coupled to the barrier region 124. Whether the flow of carriers is disrupted in the extended portion 122B of the drift region 122 can be controlled by a bias applied to the gate electrode 130. More specially, the semiconductor device 100A can be modulated to become a normally-off vertical junction gate field-effect transistor (JFET), which depends on various conditions, including the width of extended portion 122B, the dopant concentrations in the barrier region 124 or 126, or the dopant concentrations in the extended portion 122B. Accordingly, when a voltage on the gate electrode 130 is zero or below a threshold voltage, the extended portion 122B would be cut off and thus the semiconductor device 100 is at an off state. In contrast, when a voltage on the gate electrode 130 reaches a positive threshold voltage, the extended portion 122B can be turned on (i.e., which allows the flow of carriers to pass through), and thus the semiconductor device 100 is at an on state.

The exemplary materials of the gate electrode 130 may include metals or metal compounds. The gate electrode 130 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The nitride-based semiconductor layer 140 is disposed on the extending portion 122B of the drift region 122. The nitride-based semiconductor layer 140 is in contact with the extending portion 122B. The nitride-based semiconductor layer 140 is located between the barrier regions 124 and 126. The nitride-based semiconductor layer 140 can be doped to have a conductivity type identical with the nitride-based semiconductor layer 110. For example, the nitride-based semiconductor layer 140 is doped to have an n+ conductivity type. In some embodiments, the dopant concentration of the nitride-based semiconductor layer 110 ranges from about $1\times10^{19}$ cm$^{-3}$ to about $1\times10^{21}$ cm$^{-3}$. The nitride-based semiconductor layer 140 can act as a highly doped contact region on the cut-off region, so as to lower the contact resistance between the cut-off region and a layer/an electrode to be formed thereon. The exemplary materials of the nitride-based semiconductor layer 140 can include, for example but are not limited to, nitrides or group III-V compounds, such as GaN, AlN, InN, $In_xAl_yGa_{(1-x-y)}N$ where $x+y\leq 1$, $Al_yGa_{(1-y)}N$ where $y\leq 1$. In some embodiments, the nitride-based semiconductor layers 110, 120, and 140 each include GaN.

The source electrode 150 is disposed on the nitride-based semiconductor layer 140. The source electrode 150 is in contact with the nitride-based semiconductor layer 140. The source electrode 150 can have a width equal to or less than that of the nitride-based semiconductor layer 140. The nitride-based semiconductor layer 140 is located between the extending portion 122B of the drift region 122 and the source electrode 150 such that the source electrode 150 can be electrically coupled to the extending portion 122B via the nitride-based semiconductor layer 140. The source electrode 150 is located between the barrier regions 124 and 126. More specifically, the source electrode 150 can be arranged to be free from vertically overlapping with the barrier regions 124 and 126, which avoids any physical contact between the source electrode 150 and the barrier regions 124 and 126. Similarly, the source electrode 150 can be physically separated from the gate electrode 130 to avoid physical contact therebetween.

The source electrode 152 is disposed on the barrier region 126. The source electrode 152 is in contact with the barrier region 126. The source electrode 152 is electrically coupled to the barrier region 126. The source electrode 152 can be physically separated from the gate electrode 130 to avoid physical contact therebetween. A bias (e.g., a forward or reverse bias) applied to source electrode 152 will affect the depletion region to laterally expand across the extended portion 122B.

The drain electrode 160 is disposed on the nitride-based semiconductor layer 110. The drain electrode 160 is connected to the nitride-based semiconductor layer 110. The drain electrode 160 can make contact with the nitride-based semiconductor layer 110. The nitride-based semiconductor layers 110 and 120 are between the gate electrode 130 and the drain electrode 160. The nitride-based semiconductor layers 110 and 120 are between the source electrode 150 and the drain electrode 160. The nitride-based semiconductor layers 110 and 120 are between the source electrode 152 and the drain electrode 160.

Figure 1C:
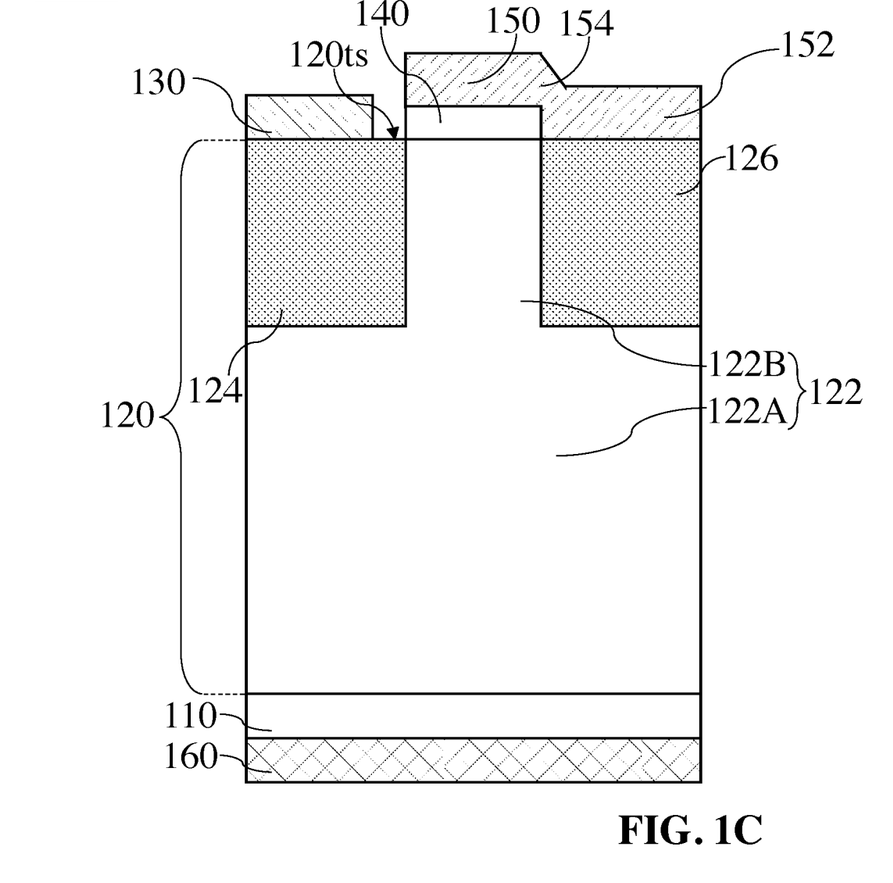
FIG. 1C is a vertical cross-sectional view across a line 1C-1C' of the semiconductor device in FIG. 1A.

FIG. 1C is a vertical cross-sectional view across a line 1C-1C' of the semiconductor device 100A in FIG. 1A. As shown in FIG. 1A and FIG. 1C, the source electrodes 150 and 152 are connected to each other, such that the source electrode 150 is electrically coupled with source electrode 152. In the exemplary illustration of FIG. 1C, the semiconductor device 100A further includes a conductive bridge 154. The conductive bridge 154 can connect the source electrode 150 to the source electrode 152. The conductive bridge 154 can extend upward from the source electrode 152 to the source electrode 154 because the source electrode 152 is in a position higher than the source electrode 150.

As afore-described, once a voltage applied to the gate electrode 130 reaches a positive threshold voltage, the extended portion 122B of the drift region 122 can be turned on, such that the flow of carriers is allowed to pass therethrough. In the exemplary illustration of FIG. 1B, the carriers can flow from the source electrode 150 to the drain electrode 160 (or from the drain electrode 160 to the source electrode 150). Furthermore, the p-n junction formed between the base portion 122A and the barrier region 124 can provide a diode (e.g., an integrated body diode), which may be effective between the source electrode 152 and the drain electrode 160. In this regard, the source electrode 152 in contact with the p-type doping can serve as a p-side terminal of the diode, and the drain electrode 160 in contact with the n+-type doping can serve as an n-side terminal of the diode.

The source electrodes 150, 152 and the drain electrode 160 can include, for example but are not limited to, metals, alloys, doped semiconductor materials (such as doped crystalline silicon), compounds such as silicides and nitrides, other conductor materials, or combinations thereof. The exemplary materials of the source electrodes 150, 152 and the drain electrode 160 can include, for example but are not limited to, Ti, AlSi, TiN, or combinations thereof. Each of the source electrodes 150, 152 and the drain electrode 160 may be a single layer, or plural layers of the same or different composition. In some embodiments, the source electrodes 150, 152 form ohmic contacts with the nitride-based semiconductor layer 120, and the drain electrode 160 form ohmic contact with the nitride-based semiconductor layer 110. The ohmic contact can be achieved by applying Ti, Al, or other suitable materials. The conductive bridge 154 can have material identical with or similar with those of the source electrodes 150, 152 and the drain electrode 160.

In some embodiments, the source electrodes 150 and 152 can be formed from the same material. In some embodiments, the source electrodes 150 and 152 can be formed to have the same thickness. Such a configuration is advantageous to the formation of the source electrodes 150 and 152. For example, the source electrodes 150 and 152 can be formed from a single blanket conductive layer. In some embodiments, the source electrodes 150 and 152 and the conductive bridge 154 can be formed from a single blanket conductive layer so that they have the same composition. In addition, the gate electrode 130 and the source electrode 152 can be arranged to be asymmetrical about the source electrode 150. For example, the thicknesses of the gate electrode 130 and the source electrode 152 are asymmetrical about the source electrode 150. A distance from the gate electrode 130 to the source electrode 150 and a distance from the source electrode 152 to the source electrode 150 is asymmetrical about the source electrode 150. The asymmetry is advantageous to the operation of the semiconductor device 100A, which will be described below.

Figure 1D:
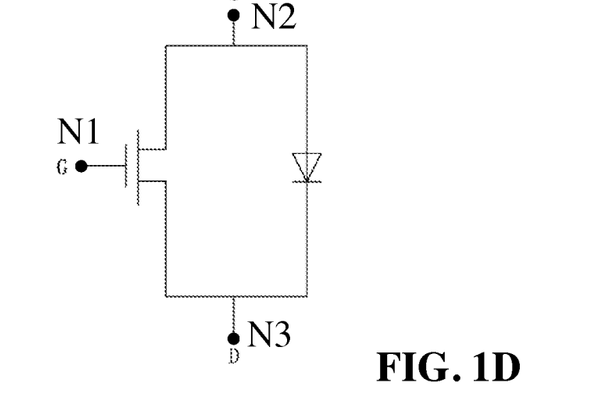
FIG. 1D is a circuit diagram of the semiconductor device in FIG. 1A according to some embodiments of the present disclosure.

With such a configuration, a vertical JFET and a diode can be integrated into the semiconductor device 100A. FIG. 1D is a circuit diagram of the semiconductor device 100A in FIG. 1A according to some embodiments of the present disclosure. As shown in FIGS. 1B and 1D, in the circuit, the gate electrode 130 is labeled as "gate G" and electrically connected to an electrical node N1; the source electrodes 150 and 152 are together labeled as "source S" and electrically connected to an electrical node N2 because they are electrically coupled with each other; and the drain electrode 160 is labeled as "drain D" and electrically connected to an electrical node N3. The electrical nodes can be electrically connected to different electrical potential sources, which can feed one or more voltages to the respective electrodes.

The operation of the semiconductor device 100A can be switched between two modes, a JEFT mode and a diode mode. In the JEFT mode, the gate G is biased by a voltage higher than the threshold, and the source S and the drain D have different electrical potentials such that carriers can flow between the source S and the drain D. In the diode mode, a voltage applied to the gate G is zero or less than the threshold, and the source S has an electrical potential higher than that of the drain D, such that at least one current can flow from the source S to the drain D.

Referring to FIG. 1B again, the barrier regions 124 and 126 are related to the JFET mode and the diode mode, respectively, and thus the barrier regions 124 and 126 can have different features, which will be advantageous to the operation for the two modes. In some embodiments, the barrier regions 124 and 126 are doped to p-type with different p-doping concentrations. For example, the barrier region 124 can have the p-doping concentration less than the p-doping concentration of the barrier region 126. The reason for such relationship is to adapt to the JFET mode and the diode mode.

Figure 2A:
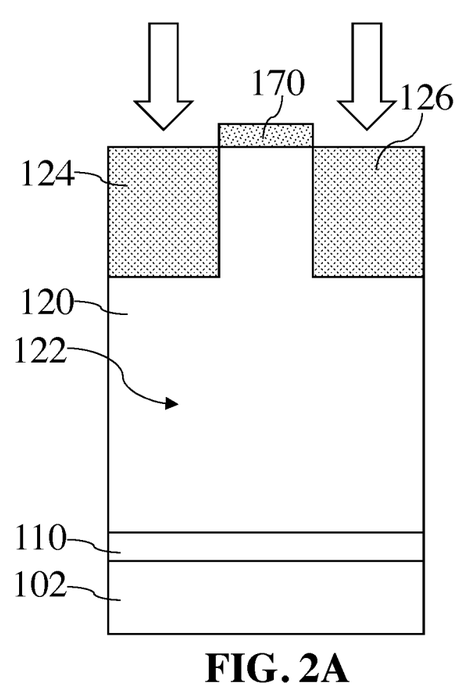
FIG. 2A, FIG. 2B, and FIG. 2C show different stages of a method for manufacturing a semiconductor device according to some embodiments of the present disclosure.
Figure 2B:
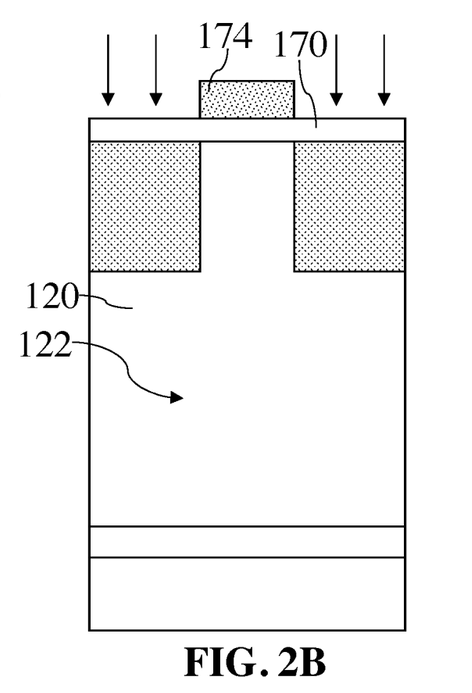
Figure 2C:
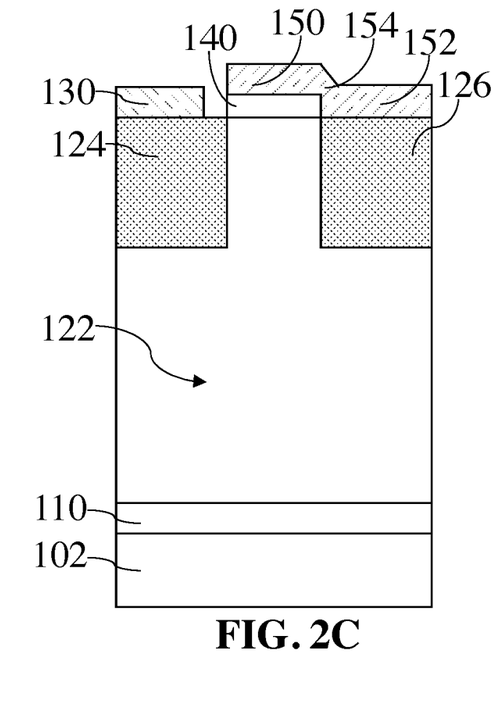

Different stages of a method for manufacturing the semiconductor device 100A are shown in FIG. 2A, FIG. 2B, and FIG. 2C, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Referring to FIG. 2A, a substrate 102 is provided. The nitride-based semiconductor layers 110 and 120 can be formed over the substrate 102 in sequence by using deposition techniques, in which the nitride-based semiconductor layer 120 has a drift region 122 on the nitride-based semiconductor layer. Then, a mask layer 170 can be on the nitride-based semiconductor layer 120 and at least one portion of the nitride-based semiconductor layer 120 is exposed. Barrier regions 124 and 126 are formed by implanting dopants into a top surface of the nitride-based semiconductor layer 120 using the mask layer 170, which can be called masked implantation techniques. The barrier regions 124 and 126 are formed on the drift region 122 and are separated from each other by a portion of the drift region 122. In some embodiments, after the ion implantation, an annealing step can be performed to activate the dopant atoms.

Referring to FIG. 2B, the mask layer 170 is removed. A blanket nitride-based semiconductor layer 172 is formed on the nitride-based semiconductor layer 120 to cover the drift region 122 and the barrier regions 124 and 126. A mask layer 174 can be on the blanket nitride-based semiconductor layer 172 and at least one portion of the blanket nitride-based semiconductor layer 172 is exposed. Then, a patterning process can be performed for removing excess portions of the blanket nitride-based semiconductor layer 172. In some embodiments, the patterning process can include an etching process.

Referring to FIG. 2C, after the patterning process, a nitride-based semiconductor layer 140 is formed, in which the barrier regions 124 and 126 are exposed. A gate electrode 130 and source electrodes 150 and 152 are formed. The gate electrode 130 is formed on the barrier region 124. The source electrode 150 is formed on the drift region 122 and on the nitride-based semiconductor layer 140. The source electrode 150 is formed on the barrier region 126. With respect to the formation of the source electrodes 150 and 152, it can be achieved by forming a blanket conductive layer on the nitride-based semiconductor layer. Then, the blanket conductive layer is patterned to form the source electrodes 150 and 152 and a conductive bridge 154 connecting the source electrodes 150 and 152. Thereafter, the substrate 102 can be removed and a drain electrode can be formed to connect to the nitride-based semiconductor layer 110, thereby obtain the structure as shown in FIG. 1B and FIG. 1C.

The formation of the barrier regions 124 and 126 can be achieved by another way. Different stages of a method for forming the barrier regions 124 and 126 are shown in FIG. 3A and FIG. 3B.

Figure 3A:
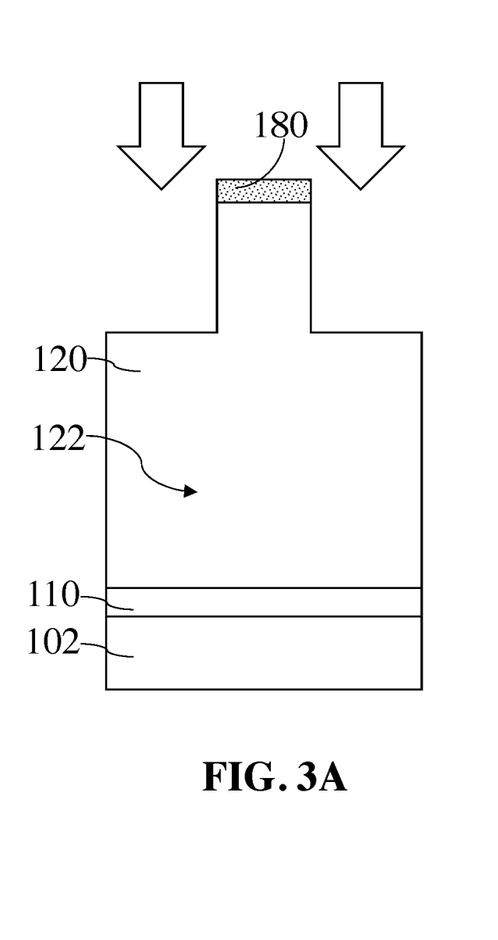
FIG. 3A and FIG. 3B show different stages of a method for manufacturing a semiconductor device according to some embodiments of the present disclosure.

Referring to FIG. 3A, a substrate 102 is provided. The nitride-based semiconductor layers 110 and 120 can be formed over the substrate 102 in sequence by using deposition techniques, in which the nitride-based semiconductor layer 120 has a drift region 122 on the nitride-based semiconductor layer 110. Then, a mask layer 180 can be formed on the nitride-based semiconductor layer 120 such that at least one portion of the nitride-based semiconductor layer 120 is exposed. Then, the exposed portion of the nitride-based semiconductor layer 120 is removed such that the nitride-based semiconductor layer 120 is recessed.

Figure 3B:
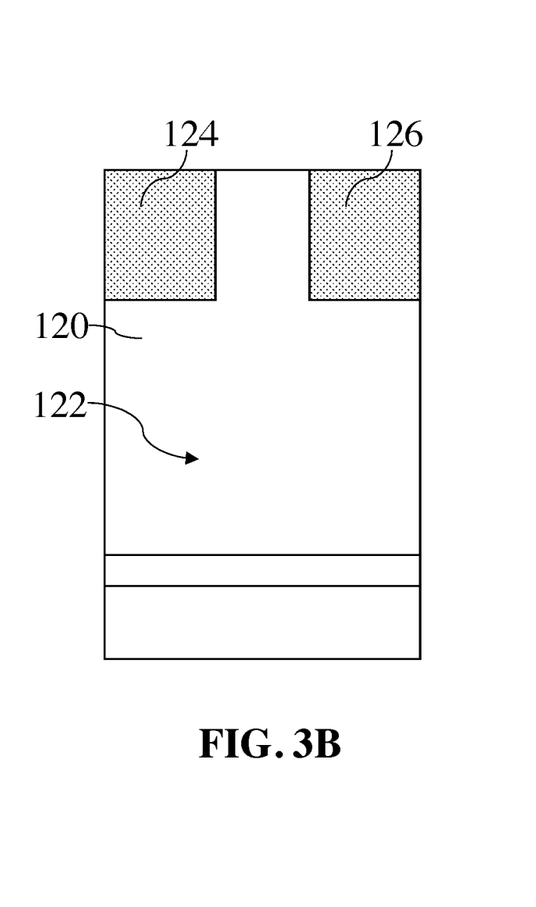

Referring to FIG. 3B, epitaxial layers can be formed from a p-type material to form barrier regions 124 and 126. The barrier regions 124 and 126 can extend inward from opposite sidewalls of the nitride-based semiconductor layer 120 to confine an inlet of the drift region 122. In some embodiments, the barrier regions 124 and 126 can be formed as being coplanar with the drift region 122 of the nitride-based semiconductor layer 120. After the formation of the barrier regions 124 and 126, the subsequent processes can be identical with or similar with FIG. 2B and FIG. 2C.

Figure 4:
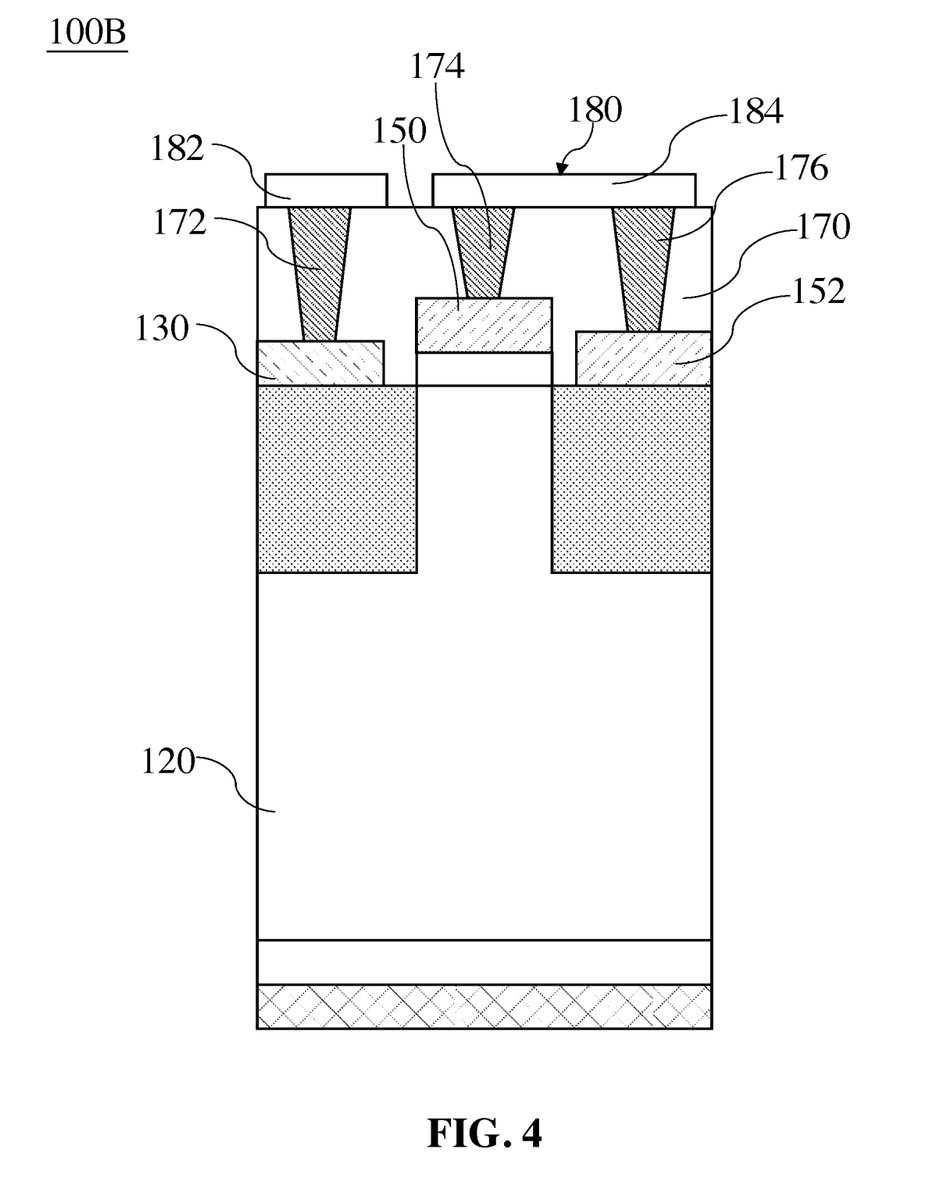
FIG. 4 is a cross-sectional view of a semiconductor device according to some embodiments of the present disclosure.

FIG. 4 is a cross-sectional view of a semiconductor device 100B according to some embodiments of the present disclosure. In the exemplary illustration of FIG. 4, the semiconductor device 100B further includes a dielectric layer 170, contact 172, 174, and 176, and a patterned conductive layer 180.

The dielectric layer 170 is disposed on the nitride-based semiconductor layer 120 and covers the gate electrode 130 and the source electrodes 150 and 152. The contact 172, 174, and 176 are located within the dielectric layer 170. The contact 172 is connected to the gate electrode 130. The contact 174 is connected to the source electrode 150. The contact 176 is connected to the source electrode 152. The contact 172, 174, and 176 may have different lengths. The patterned conductive layer 180 is disposed on the dielectric layer 170 and has portions 182 and 184 spaced apart from each other. The portion 182 of the patterned conductive layer 180 covers the contact 172 to electrically couple with the gate electrode 130. The portion 184 of the patterned conductive layer 180 covers the contacts 174 and 176 to electrically couple with the source electrodes 174 and 176.

By such a configuration, the gate electrode 130 can be further connected to an external electrical potential source different from another external electrical potential source electrically coupled to the source electrodes 174 and 176. The dielectric layer 170, the contact 172, 174, and 176, and the patterned conductive layer 180 can be formed after the stage of FIG. 2C.

Figure 5:
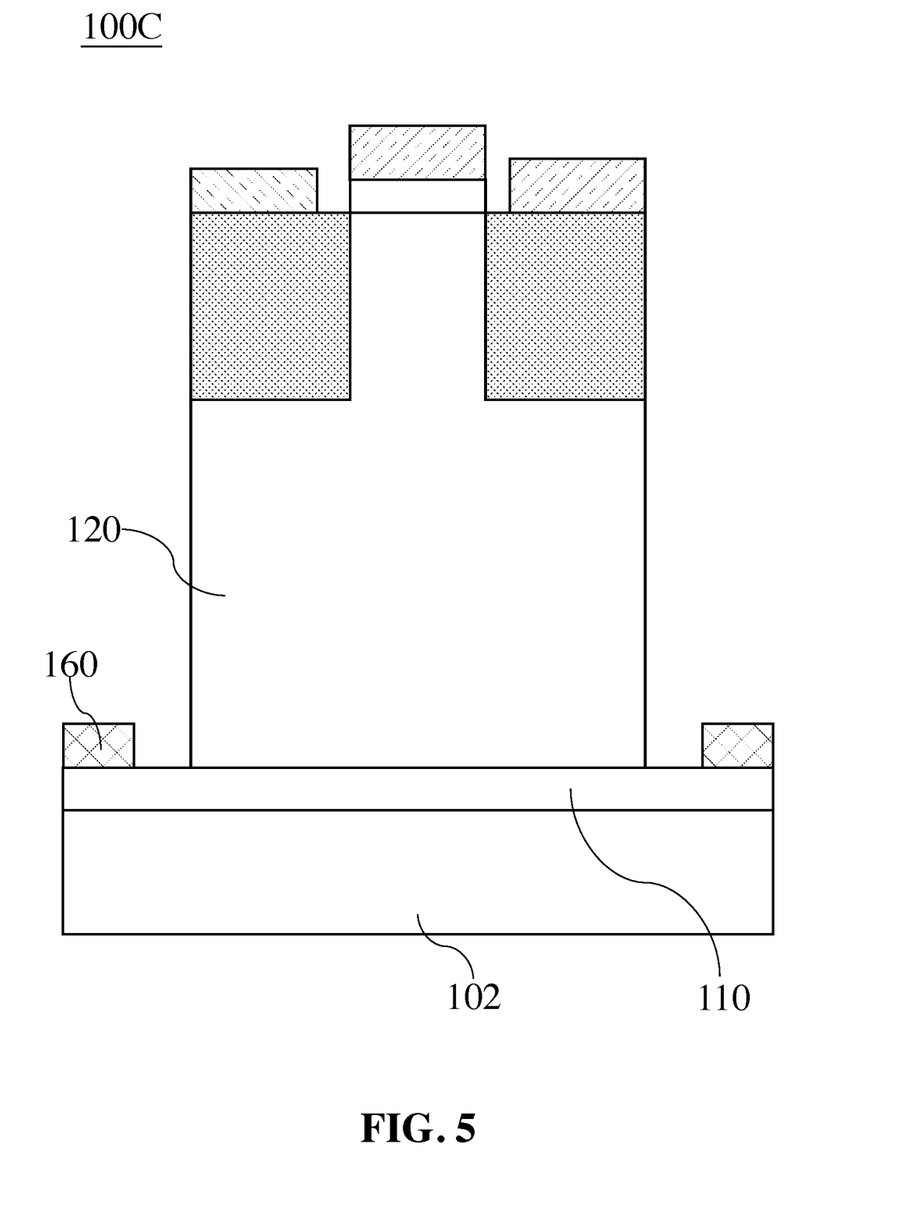
FIG. 5 is a cross-sectional view of a semiconductor device according to some embodiments of the present disclosure.

FIG. 5 is a cross-sectional view of a semiconductor device 100C according to some embodiments of the present disclosure. In the exemplary illustration of FIG. 5, the semiconductor device 100C further includes a substrate 102.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The nitride-based semiconductor layer 110 is located between the substrate 102 and the nitride-based semiconductor layer 120. The nitride-based semiconductor layer 110 has a width greater than the nitride-based semiconductor layer 120 so that the nitride-based semiconductor layer 110 has a top surface expanding/extending outside the nitride-based semiconductor layer 120. That is, the top surface of the nitride-based semiconductor layer 110 can be free from coverage of the nitride-based semiconductor layer 120. The drain electrodes 160 are disposed on the top surface of the nitride-based semiconductor layer 110. Although the configuration with respect to the drain electrodes 160 vary, the semiconductor device 100C can still be operated to switch between the JFET and the diode modes.

Figure 6:
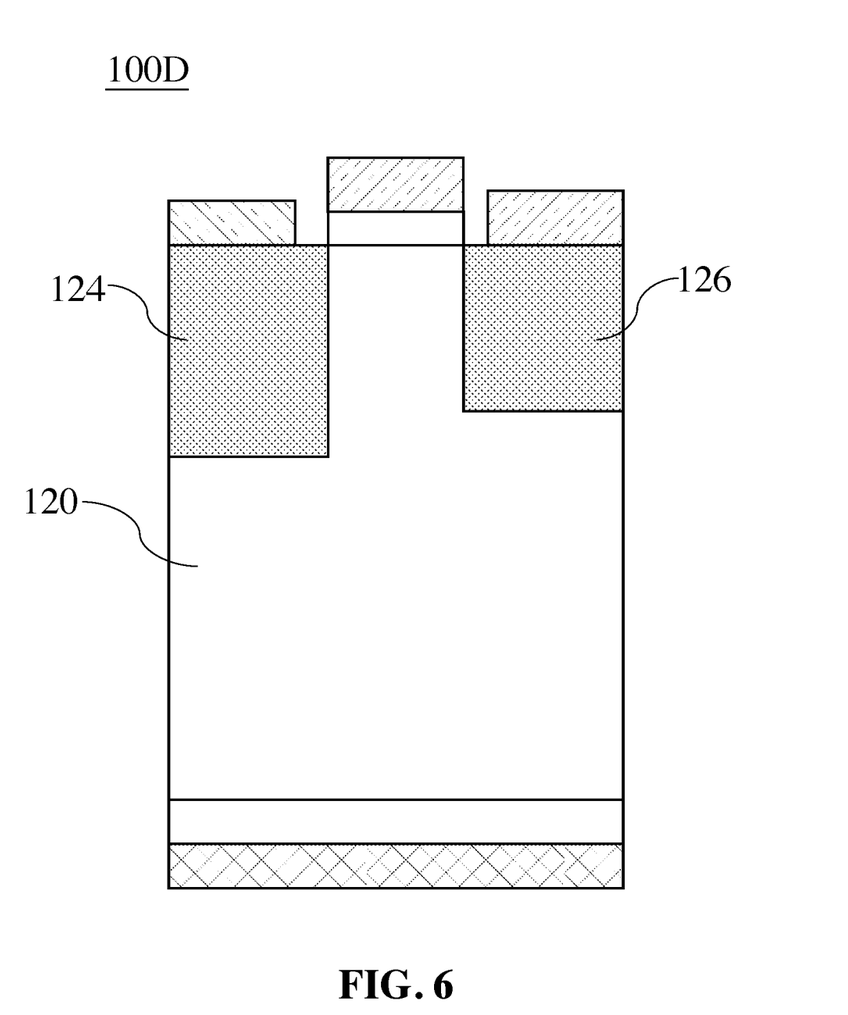
FIG. 6 is a cross-sectional view of a semiconductor device according to some embodiments of the present disclosure.

FIG. 6 is a cross-sectional view of a semiconductor device 100D according to some embodiments of the present disclosure. In the exemplary illustration of FIG. 6, the barrier regions 124 and 126 are doped to p-type with different dimensions. That is, the barrier regions 124 and 126 can have different downward-extending lengths for the top surface of the nitride-based semiconductor layer 120. For example, to comply with the requirement for the JFET and diode modes, the barrier region 124 can have a downward-extending length greater than the downward-extending length of the barrier region 126.

Figure 7:
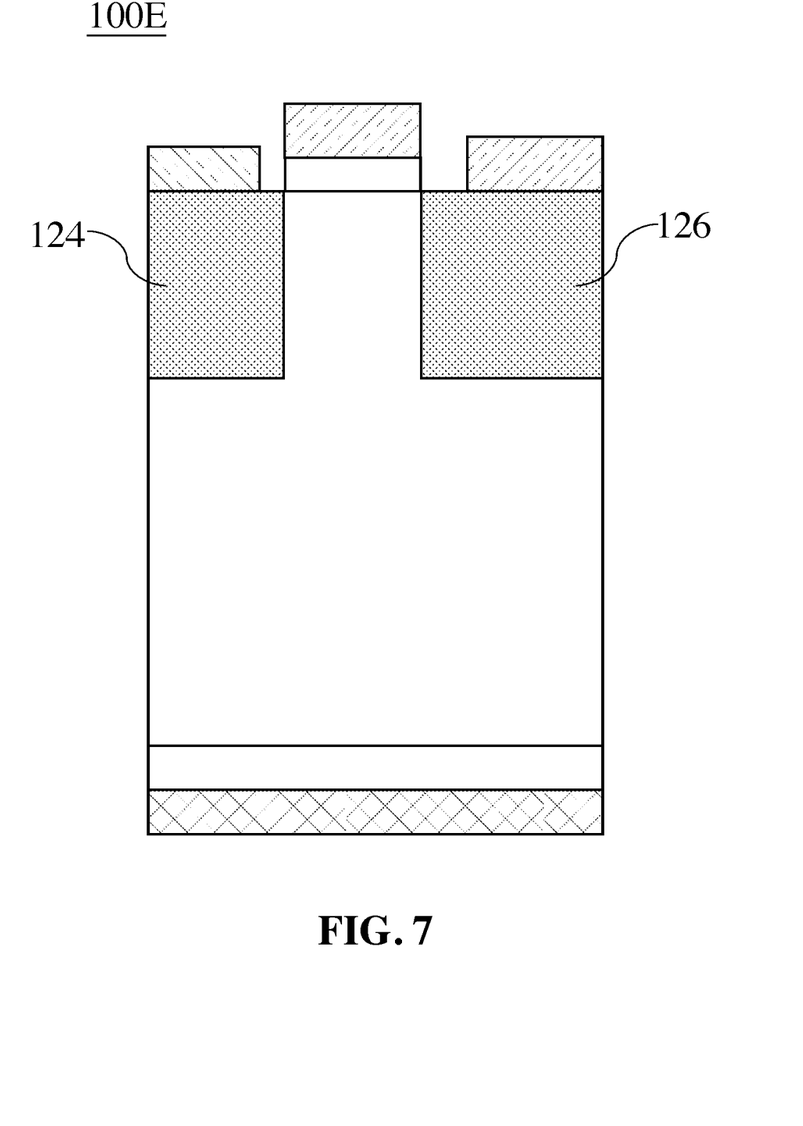
FIG. 7 is a cross-sectional view of a semiconductor device according to some embodiments of the present disclosure.

FIG. 7 is a cross-sectional view of a semiconductor device 100E according to some embodiments of the present disclosure. In the exemplary illustration of FIG. 7, the barrier regions 124 and 126 are doped to p-type with different dimensions. That is, the barrier regions 124 and 126 are doped to p-type with different widths. For example, to comply with the requirement for the JFET and diode modes, the barrier region 124 has a width less than the width of the barrier region 126.

It should be noted that the above semiconductor devices can be manufactured by the afore-mentioned different processes in order to meet different electrical requirements. Furthermore, to comply with the requirement for the JFET and diode modes, it is available to combine the different embodiments describe above. For example, the two barrier regions can have different widths and downward-extending lengths.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
   a first nitride-based semiconductor layer doped to a first conductivity type;
   a second nitride-based semiconductor layer disposed over the first nitride-based semiconductor layer and comprising a drift region doped to a second conductivity type, a first barrier region doped to a third conductivity type, and a second barrier region doped to the third conductivity type, wherein the first and second barrier regions extend downward from a top surface of the second nitride-based semiconductor layer and are separated from each other by a portion of the drift region;
   a gate electrode disposed on the first barrier region;
   a first source electrode disposed on the portion of the drift region, wherein the first source electrode is free from vertically overlapping with the first and second barrier regions;
   a second source electrode disposed on the second barrier region and electrically coupled with the first source electrode, wherein the first source electrode is disposed between the gate electrode and the second source electrode; and
   a drain electrode connected to the first nitride-based semiconductor layer,
   wherein a part of the first source electrode and a part of the second source electrode are spaced apart from each other, and
   wherein the first and second barrier regions are doped to p-type, a distance between a bottom surface of the first barrier region and the top surface of the second nitride-based semiconductor layer is a first distance, a distance between a bottom surface of the second barrier region and the top surface of the second nitride-based semiconductor layer is a second distance, and the first distance is greater than the second distance.

2. The semiconductor device of claim 1, wherein the first and second barrier regions are doped to p-type with different p-doping concentrations.

3. The semiconductor device of claim 2, wherein the first barrier region has the p-doping concentration less than the p-doping concentration of the second barrier region.

4. The semiconductor device of claim 1, wherein the first and second barrier regions are doped to p-type with different widths.

5. The semiconductor device of claim 4, wherein the first barrier region has the width less than the width of the second barrier region.

6. The semiconductor device of claim 1, wherein the gate electrode and the second source electrode are asymmetrical about the first source electrode.

7. The semiconductor device of claim 1, further comprising:
   a conductive bridge connecting the first source electrode to the second source electrode, wherein the first and second source electrodes and the conductive bridge are the same material.

8. The semiconductor device of claim 1, further comprising:
   a first contact connected to the first source electrode;
   a second contact connected to the second source electrode; and
   a patterned conductive layer electrically connected the first contact to the second contact.

9. The semiconductor device of claim 1, wherein the first nitride-based semiconductor layer is doped to $n^+$ type, and the drift region is doped to $n^-$ type.

10. The semiconductor device of claim 1, wherein the gate electrode is physically separated from the first and second source electrodes.

11. The semiconductor device of claim 1, wherein the first and second source electrodes have the same thickness.

12. The semiconductor device of claim 1, further comprising a third nitride-based semiconductor layer located between the second nitride-based semiconductor layer and the first source electrode and doped to the first conductivity type.

13. The semiconductor device of claim 12, wherein the first source electrode forms an ohmic contact with the third nitride-based semiconductor layer.

* * * * *